(12) United States Patent
Yi et al.

(10) Patent No.: US 10,153,359 B2
(45) Date of Patent: Dec. 11, 2018

(54) SEMICONDUCTOR STRUCTURE AND METHOD FOR FORMING THE SAME

(71) Applicant: UNITED MICROELECTRONICS CORP., Hsinchu (TW)

(72) Inventors: Liang Yi, Singapore (SG); Shen-De Wang, Zhudong Township, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/234,525

(22) Filed: Aug. 11, 2016

(65) Prior Publication Data

US 2018/0047842 A1    Feb. 15, 2018

(51) Int. Cl.
*H01L 29/66* (2006.01)
*H01L 21/28* (2006.01)
*H01L 29/423* (2006.01)
*H01L 27/11546* (2017.01)

(52) U.S. Cl.
CPC .. *H01L 29/66825* (2013.01); *H01L 21/28273* (2013.01); *H01L 27/11546* (2013.01); *H01L 29/42324* (2013.01); *H01L 29/66545* (2013.01)

(58) Field of Classification Search
CPC ............. H01L 29/788; H01L 29/66825; H01L 29/518; H01L 29/66833; H01L 29/792
See application file for complete search history.

(56) References Cited

U.S. PATENT DOCUMENTS

| | | | |
|---|---|---|---|
| 8,536,006 B2 | 9/2013 | Shroff et al. | |
| 8,658,497 B2 | 2/2014 | Shroff et al. | |
| 9,583,499 B1* | 2/2017 | Zhu | ................... H01L 27/11524 |
| 2008/0050875 A1 | 2/2008 | Moon et al. | |
| 2013/0228843 A1* | 9/2013 | Lim | ...................... H01L 29/788 |
| | | | 257/315 |

OTHER PUBLICATIONS

Aaron Chen et al., U.S. Appl. No. 15/132,574, filed Apr. 19, 2016, First Named Applicant: United Microelectronics Corp., Hsinchu, TW.

* cited by examiner

*Primary Examiner* — Jose R Diaz
(74) *Attorney, Agent, or Firm* — WPAT, PC

(57) ABSTRACT

A semiconductor structure and a method for forming the same are provided. The semiconductor structure comprises a substrate, at least a first cell, and at least a second cell. The substrate has a first region and a second region. The first and second cells are in the first and second regions respectively. The first cell comprises a first dielectric layer, a floating gate electrode, an oxide-nitride-oxide (ONO) gate dielectric layer, a second dielectric layer, and a control gate electrode. The ONO gate dielectric layer is on the floating gate electrode in the first dielectric layer on the substrate. The control gate electrode is in both of the first dielectric layer and the second dielectric layer on the first dielectric layer. The ONO gate dielectric layer contacting with the control gate electrode is wholly below a top surface of the first dielectric layer.

6 Claims, 4 Drawing Sheets

SEMICONDUCTOR STRUCTURE AND METHOD FOR FORMING THE SAME

BACKGROUND

Technical Field

The disclosure relates to a semiconductor structure and a method for forming the same, and more particularly to a semiconductor structure comprising a logic cell and a memory cell and a method for forming the same.

Description of the Related Art

Size of semiconductor structure has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical performance, would be one of the important issues of the device for the manufacturers. Generally, a semiconductor structure with good electrical performance requires the elements with complete profiles.

In some cases, a semiconductor structures comprises logic cells and memory cells formed in different regions of a substrate. The memory cells usually have gate electrodes higher than gate electrodes for the logic cells, and thus would be easily damaged during process steps for forming the logic cells. It is thus expected to develop a manufacturing method compatible with processes of forming different gate-height cells in the different regions of the substrate.

SUMMARY

According to an embodiment, a semiconductor structure is provided. The semiconductor structure comprises a substrate, at least a first cell, and at least a second cell. The substrate has a first region and a second region. The first cell is in the first region. The second cell is in the second region. The first cell comprises a first dielectric layer, a floating gate electrode, an oxide-nitride-oxide (ONO) gate dielectric layer, a second dielectric layer, and a control gate electrode. The first dielectric layer is on the substrate. The floating gate electrode is in the first dielectric layer. The ONO gate dielectric layer is on the floating gate electrode. The second dielectric layer is on the first dielectric layer. The control gate electrode is in both of the first dielectric layer and the second dielectric layer. The ONO gate dielectric layer contacting with the control gate electrode is wholly below a top surface of the first dielectric layer.

According to another embodiment, a method for forming a semiconductor structure is provided, comprising the following steps. At least a first cell is formed in a first region of a substrate. At least a second cell is formed in a second region of the substrate. The first cell is formed by a method comprising the following steps. An ONO gate dielectric layer consisting of a lower oxide layer, a medium nitride layer and an upper oxide layer is formed on a floating gate electrode on the substrate. A sacrificial control gate electrode is formed on the ONO gate dielectric layer. The sacrificial control gate electrode is removed by an etching step stopping on the upper oxide layer of the ONO gate dielectric layer. A replacing control gate electrode is formed on the ONO gate dielectric layer.

Figure 1:
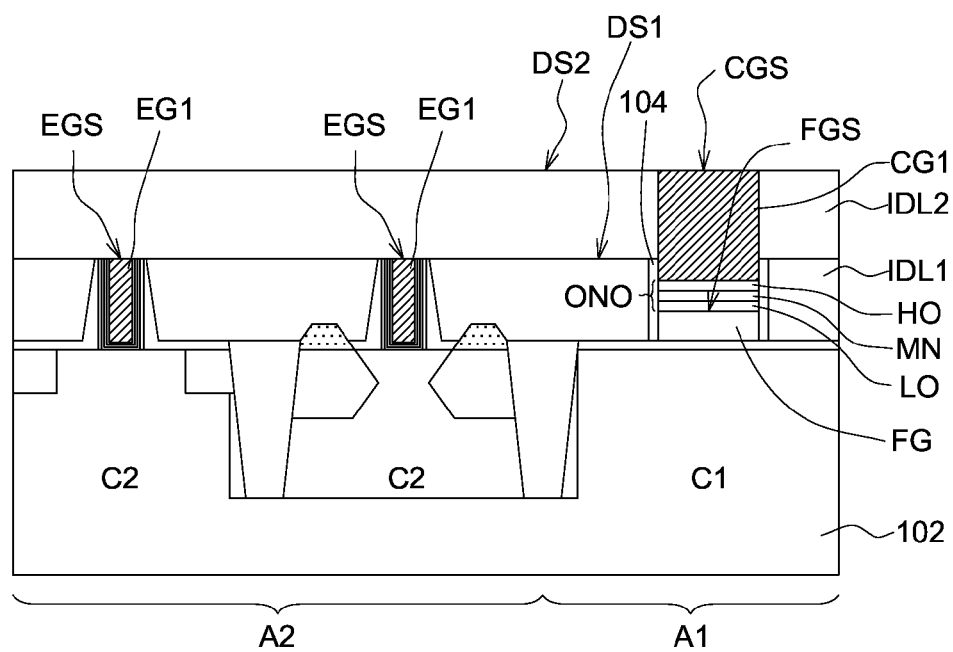
FIG. 1 illustrates a cross-section view of a semiconductor structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a semiconductor device and a method of manufacturing the same are provided. According to the disclosure, the method comprising forming different cells can prevent a cell being damaged from a process for forming another cell, and thus maintain property of a device.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIG. 1 illustrates a cross-section view of a semiconductor structure according to an embodiment. As shown in FIG. 1, a substrate 102 has a first region A1 and a second region A2 adjacent to the first region A1. At least a first cell C1 is in the first region A1, and at least a second cell C2 is in the second region A2. In an embodiment, the first area A1 may be a region to form memory cells (i.e. the first cell C1) for data storage, such as a non-volatile memory cell, a flash memory cell, etc., and the second area A2 may be a region to form logic cells (i.e. the second cell C2) for logical operation. For example, the second cell C2 may be for a 28 nm high-k metal gate (HKMG).

The first cell C1 comprises a floating gate electrode FG, an oxide-nitride-oxide (ONO) gate dielectric layer on the floating gate electrode FG and consisting of a lower oxide layer LO, a medium nitride layer MN on the lower oxide layer LO, and an upper oxide layer HO on the medium nitride layer MN, and a control gate electrode CG1 on the ONO gate dielectric layer. In figures, the ONO gate dielectric layer is also shown as a symbol of "ONO". The first cell C1 may further comprise a dielectric spacer 104 on sidewalls of the floating gate electrode FG, the ONO gate dielectric layer and the control gate electrode CG1.

A top surface FGS of the floating gate electrode FG is wholly covered by the ONO gate dielectric layer, for example covered by the lower oxide layer LO of the ONO gate dielectric layer. The floating gate electrode FG and the ONO gate dielectric layer are in a first dielectric layer IDL1 on the substrate 102. The control gate electrode CG1 is in both of the first dielectric layer IDL1 and a second dielectric layer IDL2 on the first dielectric layer IDL1.

As shown in FIG. 1, in embodiments, the ONO gate dielectric layer contacting with the control gate electrode CG1 is wholly below a top surface DS1 of the first dielectric layer IDL1. The ONO gate dielectric layer is wholly below a top surface of the second cell C2. The top surface DS1 of the first dielectric layer IDL1 is aligned with (or coplanar with) the top surface of the second cell C2. In an embodiment, the top surface of the second cell C2 may be or comprise a top surface EGS of a cell gate electrode EG1 of the second cell C2. A top surface DS2 of the second dielectric layer IDL2 is aligned with a top surface CGS of the control gate electrode CG1. The top surface CGS of the control gate electrode CG1 is higher than the top surface EGS of the cell gate electrode EG1.

FIGS. 2-7 illustrate a process flow for manufacturing the semiconductor structure as shown in FIG. 1 according to an embodiment. In embodiments, during the process flow, parts for the first cell C1 (FIG. 1) are formed in the first region A1, and parts for the second cell C2 are formed in the second region A2. The first cell C1 and the second cell C2 are formed with gate-last process respectively.

Figure 2:
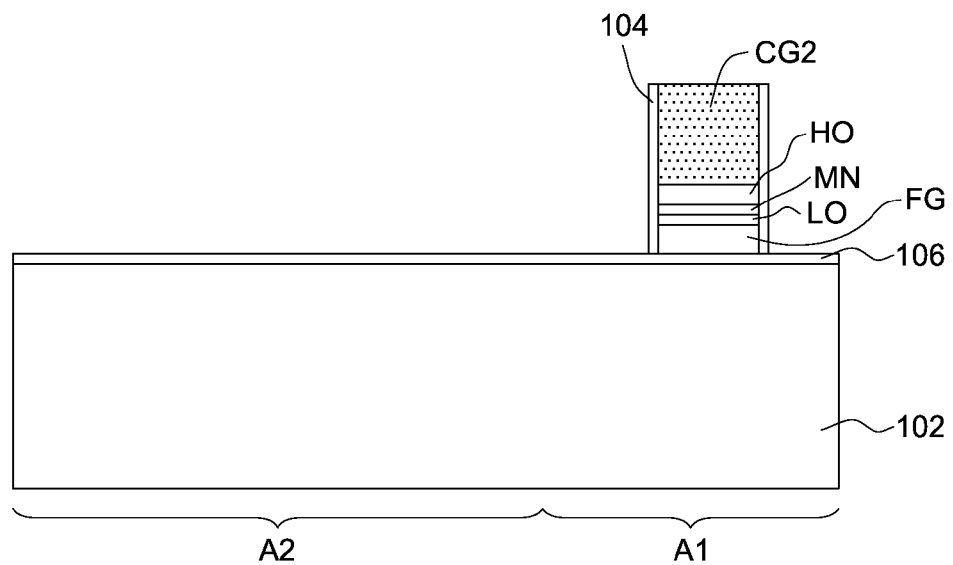
FIGS. 2-7 illustrate a process flow for manufacturing the semiconductor structure as shown in FIG. 1 according to an embodiment.

Referring to FIG. 2, the substrate 102 is provided, such as a silicon substrate or other suitable semiconductor materials. A dielectric film 106, such as a tunnel oxide, may be formed on the substrate 102 in the first region A1 and the second region A2. The floating gate electrode FG may be formed on the dielectric film 106 in the first region A1. The ONO gate dielectric layer consisting of the lower oxide layer LO, the medium nitride layer MN and the upper oxide layer HO is formed on the floating gate electrode FG. A (sacrificial) control gate electrode CG2 may be formed on the ONO gate dielectric layer.

In an embodiment, the floating gate electrode FG, the ONO dielectric layer and the control gate electrode CG2 are patterned by using a mask simultaneously, so that a sidewall of the floating gate electrode FG, sidewalls of the lower oxide layer LO, the medium nitride layer MN and the upper oxide layer HO of the ONO gate dielectric layer, and a sidewall of the control gate electrode CG2 are coplanar with (or aligned with) each other. The dielectric spacer 104 may be formed on the sidewalls of the floating gate electrode FG, the ONO dielectric layer and the control gate electrode CG2.

Figure 3:
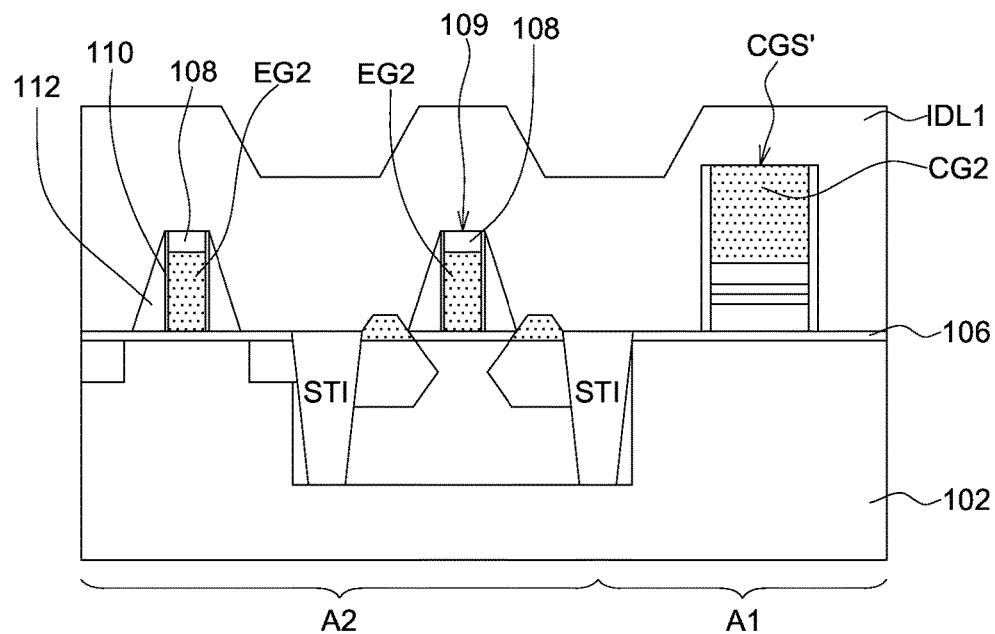

Referring to FIG. 3, a (sacrificial) cell gate electrode EG2 is formed on the dielectric film 106 on the substrate 102 in the second region A2. In an embodiment, the cell gate electrode EG2 may have a height of 550 Å. A cap layer 108 is formed on the cell gate electrode EG2. A spacer layer 110 may be formed on sidewalls of the cell gate electrode EG2 and the cap layer 108. A spacer structure 112 may be formed on the spacer layer 110. Other elements, such as a source/drain, doped wells, etc. known in the art, for logic cells in the second region A2 are not redundantly described herein. A top surface CGS' of the (sacrificial) control gate electrode CG2 is higher than a top surface of the second cell, i.e. a top surface 109 of the cap layer 108 in this step. In an embodiment, the left and right cells in the second region A2 may have a N-type doped well and a P-type doped well as active regions, respectively. Shallow trench isolations STI may be formed in the substrate 102. The first dielectric layer IDL1, such as a low-temperature undoped silicate glass (LTUSG), is formed on the substrate 102 and to fill empty spaces between the cells in the first region A1 and the second region A2.

Figure 4:
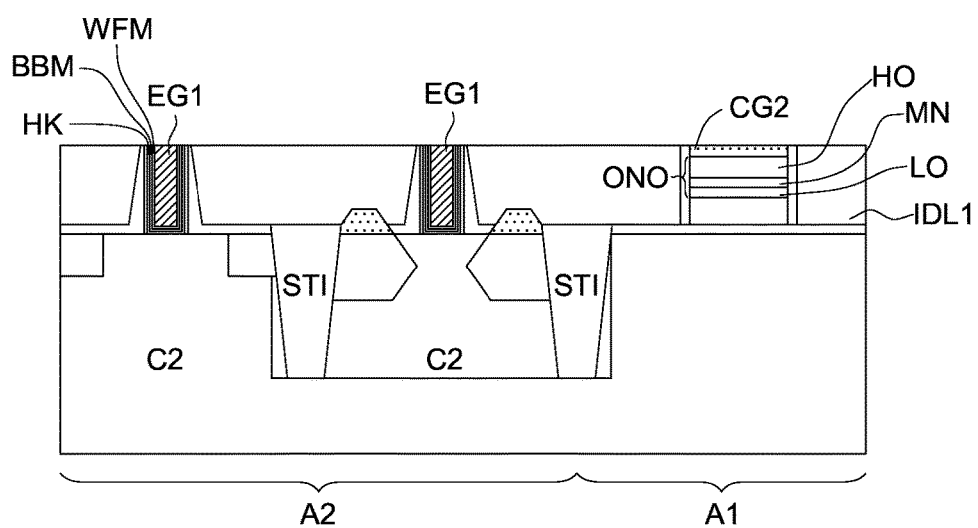

Referring to FIG. 4, the cap layer 108 and the (sacrificial) cell gate electrode EG2 (FIG. 3) may be replaced with a film structure and the (replacing) cell gate electrode EG1 on the film structure. In an embodiment, for example, in the HKMG logic application, the (sacrificial) cell gate electrode EG2 (FIG. 3) is polysilicon, the cap layer 108 is silicon nitride and the (replacing) cell gate electrode EG1 is a metal. In addition, the film structure on which the cell gate electrode EG1 is formed may comprise a high-k dielectric film HK, a bottom barrier metal BBM and a work function metal WFM, for example. In an embodiment, a planarization process, such as a CMP process, may be conducted to flatten the cell gate electrode EG1 of the second cell C2, and the (sacrificial) control gate electrode CG2 and the first dielectric layer IDL1.

In embodiments, the ONO dielectric layer for the memory cell (first cell C1) is formed in the process illustrate in FIG. 2, in other words the ONO dielectric layer is formed before the gate-last process for the logic cell (second cell C2), thus the logic cell is not affected by a thermal budget from forming the ONO dielectric layer, especially is not affected by a thermal budget from the medium nitride layer MN which is usually higher than a thermal budget from a formation of an oxide layer.

Figure 5:
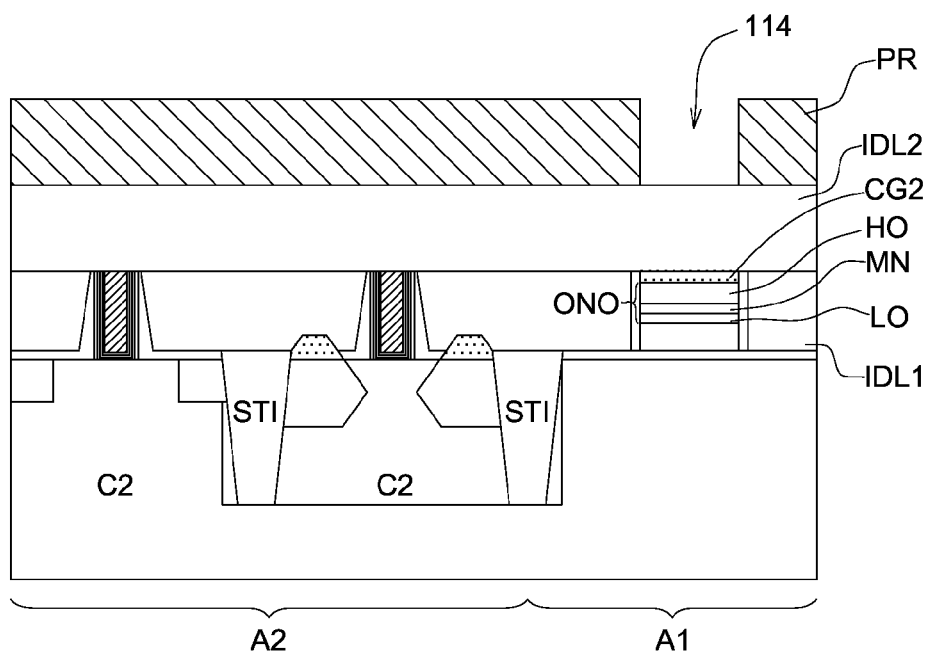

Referring to FIG. 5, the second dielectric layer IDL2, such as an undoped silicate glass (USG), is formed to cover the first dielectric layer IDL1, and the cells in first region A1 and the second region A2. A photo resist PR is formed on the second dielectric layer IDL2.

Figure 6:
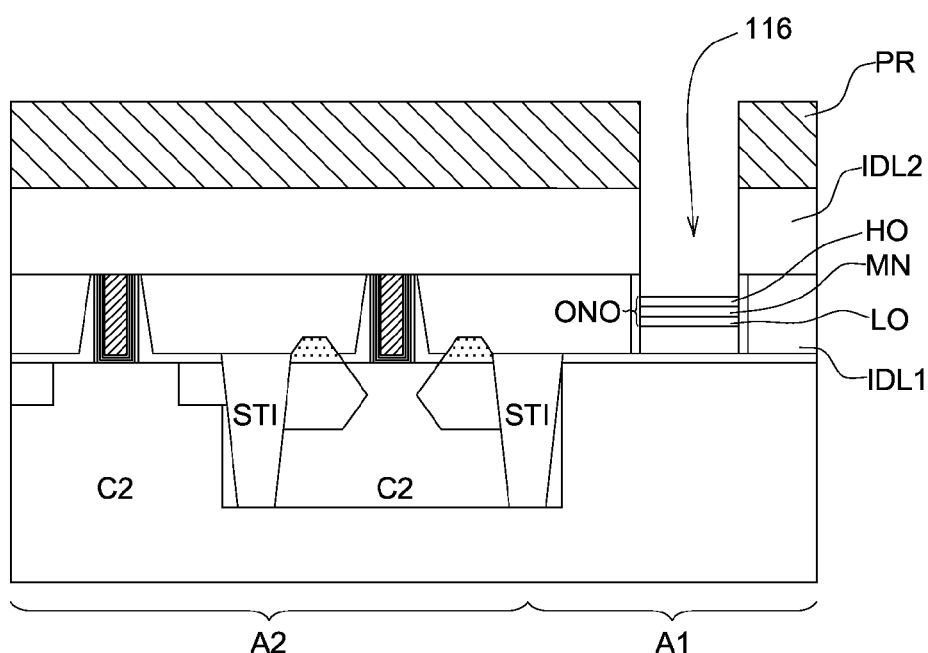

Referring to FIG. 6, the second dielectric layer IDL2 and the (sacrificial) control gate electrode CG2 under the second dielectric layer IDL2, exposed by an opening 114 of the photo resist PR, are removed by an etching step which results in a trench 116 in both of the first dielectric layer IDL1 and the second dielectric layer IDL2 and exposing the upper oxide layer HO. In embodiments, the upper oxide layer HO is thick enough to substantially not removed or only partially removed from the etching step. In other words, the etching step to remove the (sacrificial) control gate electrode CG2 stops on the upper oxide layer HO as a buffering layer. Therefore, after the etching step, the ONO dielectric layer is remained.

In embodiments, the ONO dielectric layer for the memory cell formed before the gate-last process for the logic cell (second cell C2) is still remained after the gate-last process for the logic cell, and thus no another ONO structure or nitride film for which is needed to form after the logic cell, so as to avoid a thermal budget from the ONO structure or nitride film for which that would damage the logic cell. Moreover, the remained upper oxide layer HO may be still thick enough to function for a memory layer of the cell.

In an embodiment, before the etching step (i.e. during steps illustrated through FIG. 2 to FIG. 5), the upper oxide layer HO is thicker than the medium nitride layer MN, thicker than the lower oxide layer LO, or thicker than a total thickness of the medium nitride layer MN and the lower oxide layer LO. For example, the upper oxide layer HO may have a thickness of 50 Å to 200 Å, the medium nitride layer MN may have a thickness of 20 Å to 80 Å, and the lower oxide layer LO may have a thickness of 20 Å to 80 Å.

Then, the photo resist PR may be removed.

Figure 7:
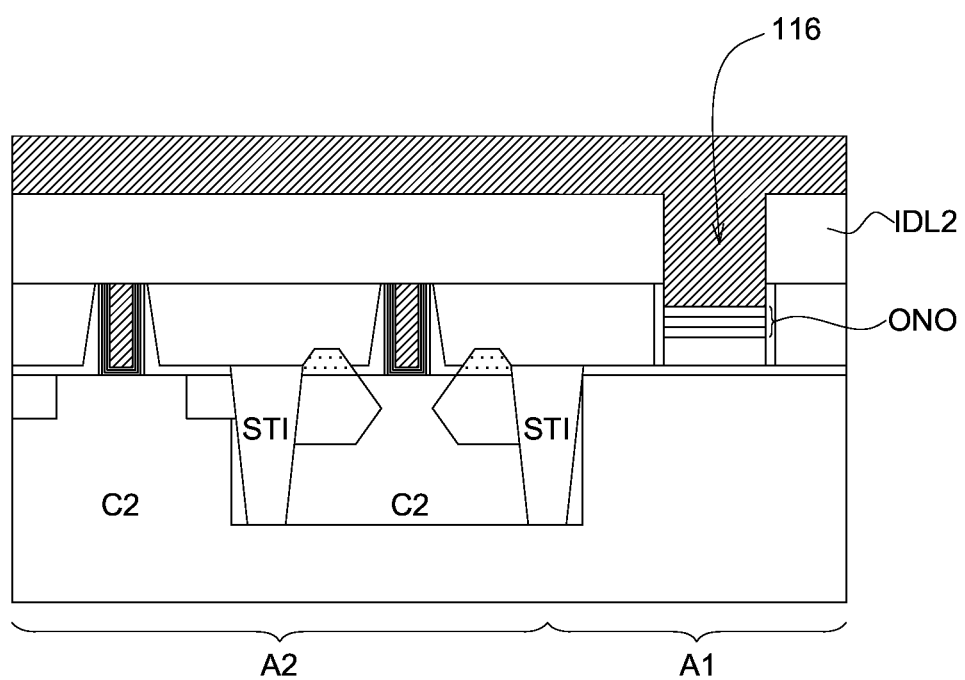

Referring to FIG. 7, the (replacing) control gate electrode CG1 is formed on the ONO gate dielectric layer and filled into the trench 116. The control gate electrode CG1 may use a metal, polysilicon, or other suitable materials for an electrode. In an embodiment, an optional oxide layer may be formed on a bottom surface and a sidewall of the trench before forming the control gate electrode CG1.

Referring back to FIG. 1, a planarization process such as a CMP method may be performed to align the top surface CGS of the (replacing) control gate electrode CG1 with the top surface DS2 of the second dielectric layer IDL2.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate having a first region and a second region;
    at least a first cell in the first region, and the first cell comprising:
        a first dielectric layer on the substrate;
        a floating gate electrode in the first dielectric layer;
        an oxide-nitride-oxide (ONO) gate dielectric layer on the floating gate electrode;
        a second dielectric layer on the first dielectric layer; and
        a control gate electrode in both of the first dielectric layer and the second dielectric layer, wherein the ONO gate dielectric layer contacting with the control gate electrode is wholly below a top surface of the first dielectric layer, a top surface of the second dielectric layer is aligned with a top surface of the control gate electrode; and
    at least a second cell in the second region.

2. The semiconductor structure according to claim 1, wherein the ONO gate dielectric layer consists of a lower oxide layer, a medium nitride layer on the lower oxide layer, and an upper oxide layer on the medium nitride layer,
    the lower oxide layer, the medium nitride layer and the upper oxide layer are coplanar with the floating gate electrode.

3. The semiconductor structure according to claim 1, wherein the ONO gate dielectric layer is wholly below a top surface of the second cell.

4. The semiconductor structure according to claim 1, wherein the top surface of the first dielectric layer is aligned with a top surface of the second cell.

5. The semiconductor structure according to claim 1, wherein the second cell comprises a cell gate electrode, the top surface of the first dielectric layer is aligned with a top surface of the cell gate electrode.

6. The semiconductor structure according to claim 1, wherein a whole top surface of the floating gate electrode is covered by the ONO gate dielectric layer.

* * * * *